(12) United States Patent
Shaw et al.

(10) Patent No.: US 11,733,272 B2
(45) Date of Patent: Aug. 22, 2023

(54) SUBMERSIBLE SPLIT CORE CURRENT SENSOR AND HOUSING

(71) Applicant: ABB Schweiz AG, Baden (CH)

(72) Inventors: Steven A. Shaw, Greenville, NC (US); Vivek Siddharth, Winterville, NC (US); David Raschka, Greenville, NC (US); Jaroslaw Wojciech Chorzepa, Greenville, NC (US); Bandeep Singh, Knightdale, NC (US)

(73) Assignee: ABB Schweiz AG, Baden (CH)

( * ) Notice: Subject to any disclaimer, the term of this patent is extended or adjusted under 35 U.S.C. 154(b) by 207 days.

(21) Appl. No.: 17/164,100

(22) Filed: Feb. 1, 2021

(65) Prior Publication Data
US 2021/0190831 A1 Jun. 24, 2021

Related U.S. Application Data

(62) Division of application No. 15/799,559, filed on Oct. 31, 2017, now Pat. No. 10,935,575.

(51) Int. Cl.
*G01R 15/18* (2006.01)
(52) U.S. Cl.
CPC .................................. *G01R 15/186* (2013.01)
(58) Field of Classification Search
CPC .................................................. G01R 15/186
See application file for complete search history.

(56) References Cited

U.S. PATENT DOCUMENTS

| | | |
|---|---|---|
| 3,760,298 A | 9/1973 | Pell |
| 3,895,296 A | 7/1975 | Boyd et al. |
| 4,048,605 A | 9/1977 | McCollum |
| 6,118,077 A | 9/2000 | Takeuchi |
| 6,211,764 B1 | 4/2001 | Schweitzer, Jr. |
| 9,607,749 B2 | 3/2017 | Cook et al. |
| 10,935,575 B2 * | 3/2021 | Shaw .................... G01R 15/186 |

(Continued)

FOREIGN PATENT DOCUMENTS

| | | |
|---|---|---|
| CN | 106847469 A | 6/2017 |
| EP | 3422023 A1 | 11/2019 |

(Continued)

OTHER PUBLICATIONS

European Extended Search Report, EP Appln. No. 18873584.9, dated Jul. 19, 2021, 10 pgs.

(Continued)

*Primary Examiner* — Christopher P McAndrew
*Assistant Examiner* — Zannatul Ferdous
(74) *Attorney, Agent, or Firm* — Greenberg Traurig, LLP

(57) ABSTRACT

A submersible current sensor for sensing a current in a submerged conductor includes: a split core current transformer constructed to generate an output representative of the current carried by the conductor, the split core having a first core member, a first winding disposed about at least a portion of the first core member; a second core member; and a second winding disposed about at least a portion of the second core member; and a housing, the housing including: a first housing member constructed to house the first core member and the first winding; and a second housing member constructed to house the second core member and the second winding.

9 Claims, 1 Drawing Sheet

(56) References Cited

U.S. PATENT DOCUMENTS

| | | | |
|---|---|---|---|
| 2003/0052764 A1* | 3/2003 | Iwao | H01F 38/14 336/75 |
| 2005/0156587 A1* | 7/2005 | Yakymyshyn | G01R 15/207 324/117 R |
| 2009/0102590 A1 | 4/2009 | Rhodes et al. | |
| 2012/0002351 A1* | 1/2012 | Inami | H02B 13/0356 361/618 |
| 2012/0200291 A1 | 8/2012 | Carpenter et al. | |
| 2013/0307526 A1 | 11/2013 | Seal et al. | |
| 2014/0155685 A1 | 6/2014 | Leigh | |
| 2015/0206645 A1 | 7/2015 | Cook et al. | |
| 2016/0005534 A1* | 1/2016 | Koo | H04B 5/0075 361/139 |
| 2016/0124024 A1 | 5/2016 | Jefferies | |
| 2016/0254652 A1 | 9/2016 | Rodriguez | |
| 2017/0023625 A1* | 1/2017 | Hsu | G01R 15/142 |

FOREIGN PATENT DOCUMENTS

| | | |
|---|---|---|
| WO | 2009139521 | 11/2009 |
| WO | 2017146256 A1 | 8/2017 |

OTHER PUBLICATIONS

International Search Report and Written Opinion issued in correspondence international application No. PCT/US2018/058341, dated Jan. 17, 2019, 10 pp.

\* cited by examiner

SUBMERSIBLE SPLIT CORE CURRENT SENSOR AND HOUSING

CROSS-REFERENCE TO RELATED APPLICATION

This application a divisional of U.S. patent application Ser. No. 15/799,559 filed Oct. 31, 2017, which is hereby incorporated by reference.

TECHNICAL FIELD

The present application generally relates to current sensors, and more particularly, but not exclusively, to a submersible split core current sensor and housing therefor.

BACKGROUND

Split core current sensors remain an area of interest. Some existing systems have various shortcomings, drawbacks and disadvantages relative to certain applications. For example, some split core current sensors may experience corrosion or other problems in outdoor, underground or submerged applications. Accordingly, there remains a need for further contributions in this area of technology.

SUMMARY

One embodiment of the present invention is a unique submersible current sensor. Another embodiment is a unique current transformer (CT) sensor. Another embodiment is a submersible housing for a CT sensor. Other embodiments include apparatuses, systems, devices, hardware, methods, and combinations for current sensors. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein.

DETAILED DESCRIPTION OF THE ILLUSTRATIVE EMBODIMENTS

Figure 1:
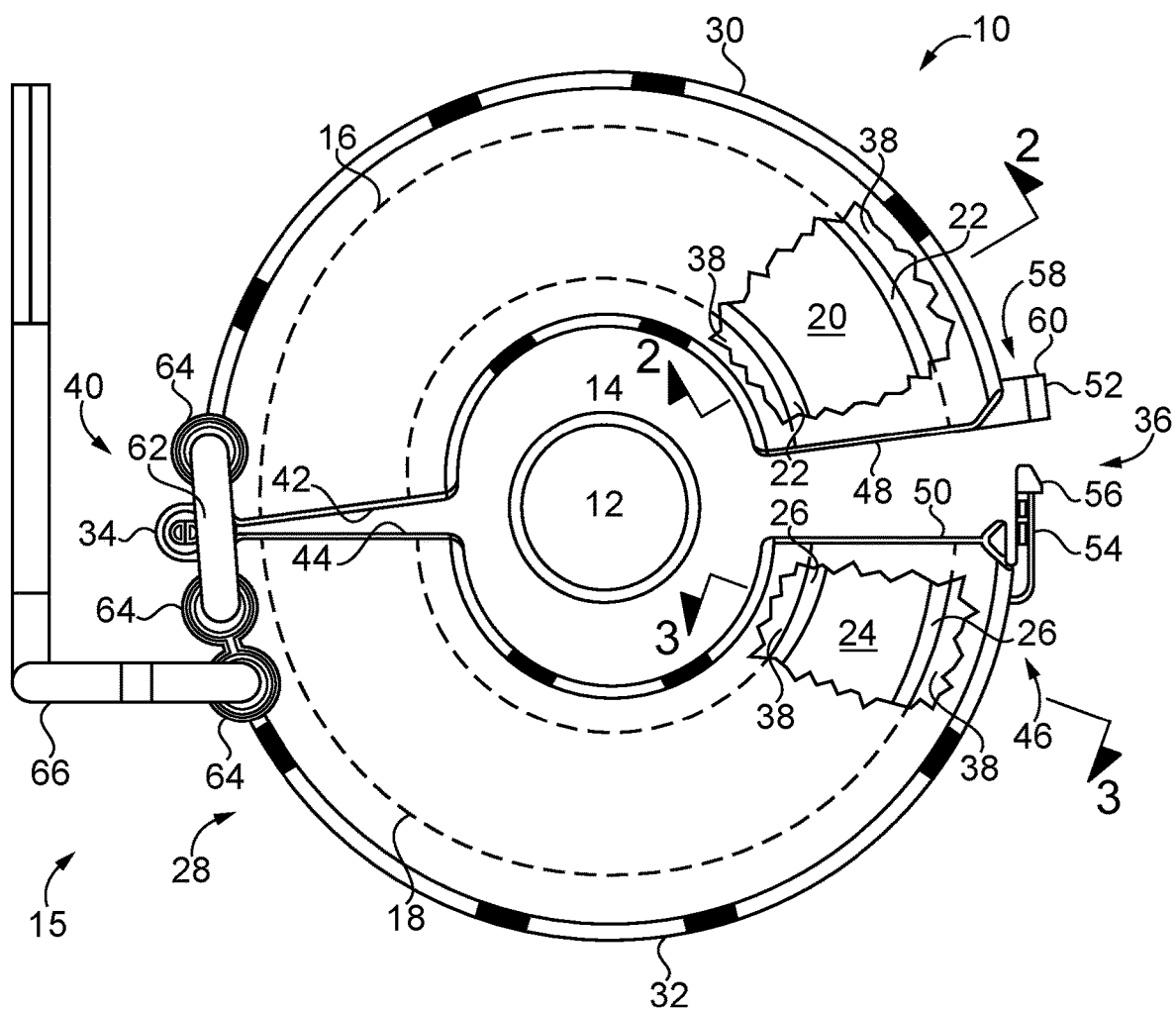
FIG. 1 schematically illustrates some aspects of a non-limiting example of a submersible split core current transformer (CT) sensor in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 2:
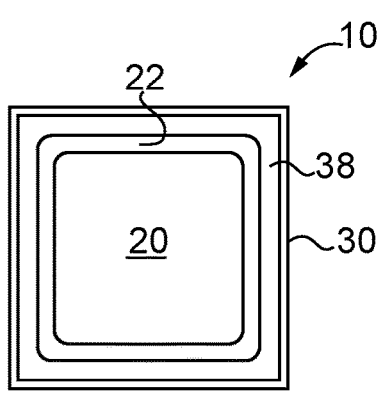
FIG. 2 schematically illustrates via a cross-sectional view some aspects of a non-limiting example of the submersible split core CT sensor of FIG. 1.
Figure 3:
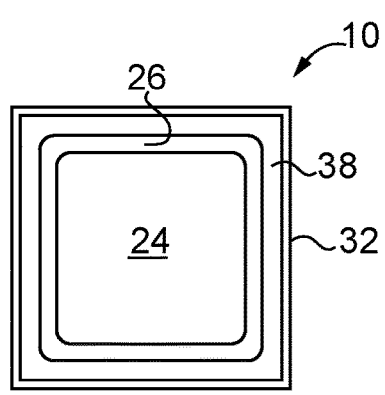
FIG. 3 schematically illustrates via a cross-sectional view some aspects of a non-limiting example of the submersible split core CT sensor of FIG. 1.

Referring to FIG. 1-3, some aspects of a non-limiting example of a submersible current sensor 10 for sensing a current in a submerged conductor are illustrated in accordance with an embodiment of the present invention. In one form, current sensor 10 is a split core current transformer (CT) sensor. Current sensor 10 is constructed to generate an output representative of the current carried by a submerged conductor 12 (shown in cross-section) that is disposed in or passing through an opening 14 in current sensor 10, e.g., in the middle of current sensor 10. Although described herein as being submerged, e.g., in water, salt water or another fluid, and as measuring current in a submerged conductor, it will be understood that current sensor 10 may be employed to measure current in conductors that are not submerged.

Current sensor 10 includes a split core transformer 15. Split core transformer 15 includes a split core transformer part 16 and a split core transformer part 18. Split core transformer part 16 includes a core member 20 and at least one winding 22 disposed about, e.g., wound about, at least a portion of core member 20. Split core transformer part 18 includes a core member 24 and at least one winding 26 disposed about, e.g., wound about, at least a portion of core member 24. In one form, split core members 20 and 24 are half toroids. In other embodiments, split core members 20 and 24 may have other shapes, which may or may not be the same. In one form, core members 20 and 24 have a square cross-section. In other embodiments, core members 20 and 24 may have circular or other cross-sections. Core members 20 and 24 are laminated, and form a high permeability core. In one form, core members 20 and 24 are formed of M4 grade laminated steel. In other embodiments, other materials, e.g., laminated ferrous steel alloys may be employed. In still other embodiments, core members 20 and 24 may be low permeability cores, e.g., formed of plastic or other materials. In some embodiments, core members 20 and 24 may be air cores, e.g., formed of air.

Current sensor 10 includes a housing 28. In one form, housing 28 is in the form of a toroid. In other embodiments, housing 28 may have another geometric shape. In one form, housing 28 has a square cross-section. In other embodiments, housing 28 may have a circular cross-section or may have another cross-sectional shape. Housing 28 is a preformed housing constructed to receive split core transformer part 16 and split core transformer part 18. In one form, housing 28 is formed of a polymer, e.g., a plastic material. In other embodiments, housing 28 may be formed of other materials in addition to or in place of a polymer, e.g., other non-conductive, non-magnetic materials. Housing 28 includes a housing member 30, a housing member 32, a hinge 34 and a latch 36.

Housing member 30 is constructed to receive and house transformer part 16, e.g., including core member 20 and windings 22. Housing member 32 is constructed to receive and house transformer part 18, e.g., including core member 24 and windings 26. In one form, core member 20 and windings 22 are together encapsulated by, e.g., within, a waterproof resin 38, e.g., a polyurethane resin, and hermetically sealed within housing member 30, for example, to protect core member 20 and windings 22 in outdoor, underground or submerged applications. Similarly, core member 24 and windings 26 are together encapsulated by, e.g., within, waterproof resin 38, and hermetically sealed within housing member 32, e.g., to protect core member 24 and windings 26 in outdoor, underground or submerged applications. Housing members 30 and 32 protect the encapsulated and sealed core members and windings from damage, e.g., due to foreign objects. In one non-limiting example, core members 20 and 24, and windings 22 and 26 may be installed in respective housing members 30 and 32, after which the waterproof resin 38 may be poured into housing members 30 and 32, encapsulating the core members and windings in the waterproof resin and hermetically sealing and securing them in the respective housing members 30 and 32.

Hinge 34 is disposed on a side 40 of housing 28, e.g., a side that is radially offset from conductor 12, and disposed adjacent to ends 42, 44 of housing members 30, 32, respectively. In one form, hinge 34 is integral with housing 28. In other embodiments, hinge 34 may be separate components affixed or adhered to housing 28. Hinge 34 pivotably couples end 42 of housing member 30 to end 44 of housing member 32, allowing housing 28 to open up, e.g., to pivot housing members 30 and 32 apart about hinge 34, in order to place sensor 10 around conductor 12, e.g., without requiring conductor 12 to be turned off and/or disconnected in order to place sensor 10 around conductor 12.

Latch 36 is disposed on a side 46 of housing 28. Side 46 is located opposite side 40, i.e., on the opposite side of housing 28 and conductor 12. Latch 36 is constructed to releasably secure housing member 30 to housing member 32. In one form, latch 36 is integral with housing 28. In other embodiments, latch 36 may be separate components affixed or adhered to housing 28. In a particular embodiment, latch 36 is constructed to releasably secure end 48 of housing member 30 to end 50 of housing member 32. In one form, latch 36 is a snap lock mechanism. In other embodiments, latch 36 may take other forms.

Latch 36 includes a latch member 52 disposed at end 42 of housing member 30. In one form, latch member 52 is integral with housing member 30. In other embodiments, latch member 52 may be a separate component affixed or adhered to housing member 30. Latch 36 also includes a latch member 54 disposed at end 44 of housing member 32. In one form, latch member 54 is integral with housing member 32. In other embodiments, latch member 54 may be a separate component affixed or adhered to housing member 32. Latch member 52 and latch member 54 are constructed to releasably latch the latch member 52 and the latch member 54 together. For example, in one form, latch member 52 has an opening constructed to receive latch member 54. Latch member 54 may be, for example, a cantilevered hook 56 that deflects to enter an opening 58 in latch member 52, and snaps back to engage a latching surface 60 to latch housing 30 and housing 32 together. In the illustrated embodiment, latch 36 may be disengaged by pressing latch member 54 in a direction toward the center of housing 28, allowing the hook portion of latch member 54 to clear latching surface 60 and disengage from latch member 52.

Sensor 10 includes a cable 62 in electrical communication with windings 22 and windings 26. Cable 62 electrically couples transformer part 16 and transformer part 18 together. Housing members 30 and 32 include sockets 64 that have openings for receiving the ends of cable 62, e.g., cylindrical openings in which the ends of cable 62 are disposed. Cable 62 is bonded to and sealed with sockets 64, e.g., bonded to and sealed with the cylindrical openings, to prevent water or other fluids from penetrating or leaking into sensor 20. Cable 62 may be bonded and sealed, for example, using waterproof resin 38. Sensor 10 also includes an output cable 66 coupled to windings 22 and 26, which provides an output signal for sensor 10. The end of output cable 66 is disposed within a socket 64 in housing 32, e.g., in a cylindrical opening in socket 64, and bonded to and sealed therein, e.g., with waterproof resin 38.

Embodiments of the present invention include a submersible current sensor for sensing a current in a submerged conductor, comprising: a split core current transformer constructed to generate an output representative of the current carried by the conductor, the split core current transformer having a first core member, a first winding disposed about at least a portion of the first core member; a second core member; and a second winding disposed about at least a portion of the second core member; and a preformed housing, the housing including: a first housing member constructed to house the first core member and the first winding; and a second housing member constructed to house the second core member and the second winding.

In a refinement, the submersible current sensor further comprises a waterproof resin, wherein the first core member and the first winding are together encapsulated by the waterproof resin; and wherein the second core member and the second winding are together encapsulated by the waterproof resin.

In another refinement, the first core member and the first winding are hermetically sealed within the first housing member with the waterproof resin; and wherein the second core member and the second winding are hermetically sealed within the second housing member with the waterproof resin.

In yet another refinement, the submersible current sensor further comprises a hinge coupling the first housing member to the second housing member.

In still another refinement, the hinge is disposed on a first side of the housing, and couples a first end of the first housing member to a first end of the second housing member, further comprising a latch disposed on a second side of the housing opposite the first side and constructed to releasably secure a second end of the first housing member to a second end of the second housing member.

In yet still another refinement, the latch includes a first latch member integral with a second end of the first housing member opposite the first end of the first housing member; and a second latch member integral with a second end of the second housing member opposite the first end of the second housing member, wherein the first latch member and the second latch member are constructed to releasably latch the first latch member and the second latch member together.

In a further refinement, the submersible current sensor further comprises a latch constructed to releasably secure the second housing member to the first housing member.

In a yet further refinement, the latch is a cantilever snap lock mechanism.

In a still further refinement, the housing is a toroid.

In a yet still further refinement, the submersible current sensor further comprises an electrical cable in communication with the first winding and/or the second winding, wherein the housing includes a socket, and wherein the cable is disposed within and sealed within the socket.

In another refinement, the housing is plastic, and includes an integral hinge and an integral latch.

Embodiments of the present invention include a submersible current transformer (CT) sensor, comprising: a polymer housing, including: a first polymer housing member with a first transformer part hermetically sealed therein, wherein the first transformer part includes a first core member and a first winding disposed about at least a portion of the first core member; and a second polymer housing member with a second transformer part hermetically sealed therein, wherein the second transformer part includes a second core member and a second winding disposed about at least a portion the second core member; and a cable coupled to the first transformer part and the second transformer part, wherein a first portion of the cable is sealed within the first polymer housing member and a second portion of the cable is sealed within the second polymer housing.

In a refinement, the submersible CT sensor further comprises a waterproof resin, wherein the first transformer part is encapsulated by the waterproof resin and hermetically sealed in the first polymer housing member with the waterproof resin; and wherein the second transformer part is encapsulated by the waterproof resin and hermetically sealed in the second polymer housing member with the waterproof resin.

In another refinement, the submersible CT sensor further comprises a hinge coupling the first polymer housing member to the second polymer housing member.

In yet another refinement, the hinge is integral with the polymer housing.

In still another refinement, the submersible CT sensor further comprises a latch constructed to latch the first polymer housing member to the second polymer housing member.

In yet still another refinement, the latch includes a first polymer latch member that is integral with the first polymer housing member, and a second polymer latch member that is integral with the second polymer housing member.

Embodiments of the present invention include a submersible housing for a current transformer (CT) sensor, comprising: a first polymer housing member constructed to house: a first split core current transformer part; and a first waterproof resin that encapsulates the first split core transformer part and hermetically seals the first split core current transformer part in the first polymer housing member; a second polymer housing member constructed to house: a second split core current transformer part; and a second waterproof resin that encapsulates the second split core transformer part and hermetically seals the second split core current transformer part in the second polymer housing; a hinge constructed to pivotably couple the first polymer housing member to the second polymer housing member at a first end of the housing; and a latch constructed to releasably attach the first polymer housing member to the second polymer housing member.

In a refinement, the hinge is a polymer hinge integral with the submersible housing.

In another refinement, the latch includes a first polymer latch member that is integral with the first polymer housing member, and a second polymer latch member that is integral with the second polymer housing member.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A submersible current transformer (CT) sensor, comprising:
    a polymer housing, including:
        a first polymer housing member with a first transformer part hermetically sealed therein, wherein the first transformer part includes a first core member and a first winding disposed about at least a portion of the first core member; and
        a second polymer housing member with a second transformer part hermetically sealed therein, wherein the second transformer part includes a second core member and a second winding disposed about at least a portion the second core member;
    a cable electrically coupled to the first transformer part and the second transformer part,
        wherein a first portion of the cable is sealed within the first polymer housing member and a second portion of the cable is sealed within the second polymer housing member, such that the CT sensor is configured to be submersible.

2. The submersible CT sensor of claim 1, further comprising a waterproof resin, wherein the first transformer part is encapsulated by the waterproof resin and hermetically sealed in the first polymer housing member with the waterproof resin; and wherein the second transformer part is encapsulated by the waterproof resin and hermetically sealed in the second polymer housing member with the waterproof resin.

3. The submersible CT sensor of claim 1, further comprising a hinge coupling the first polymer housing member to the second polymer housing member.

4. The submersible CT sensor of claim 3, wherein the hinge is integral with the polymer housing.

5. The submersible CT sensor of claim 1, further comprising a latch constructed to latch the first polymer housing member to the second polymer housing member.

6. The submersible CT sensor of claim 5, wherein the latch includes a first polymer latch member that is integral with the first polymer housing member, and a second polymer latch member that is integral with the second polymer housing member.

7. A submersible housing for a current transformer (CT) sensor, comprising:
    a first polymer housing member constructed to house: a first split core current transformer part; and a first waterproof resin that encapsulates the first split core transformer part and hermetically seals the first split core current transformer part in the first polymer housing member;
    a second polymer housing member constructed to house: a second split core current transformer part; and a second waterproof resin that encapsulates the second split core transformer part and hermetically seals the second split core current transformer part in the second polymer housing;

a hinge constructed to pivotably couple the first polymer housing member to the second polymer housing member at a first end of the housing;

a latch constructed to releasably attach the first polymer housing member to the second polymer housing member; and a cable electrically coupled to the first transformer part and the second transformer part, wherein a first portion of the cable is sealed within the first polymer housing member, and a second portion of the cable is sealed within the second polymer housing member, such that the CT sensor is configured to be submersible.

8. The submersible housing of claim 7, wherein the hinge is a polymer hinge integral with the submersible housing.

9. The submersible housing of claim 8, wherein the latch includes a first polymer latch member that is integral with the first polymer housing member, and a second polymer latch member that is integral with the second polymer housing member.

\* \* \* \* \*